ANNEALING OF METAL-PLASTIC LAMINATES

Filed March 7, 1966

INVENTORS
FRANCIS H. BRATTON,
HERBERT J. FICK
BY
Meyers & Peterson
ATTORNEYS

United States Patent Office 3,452,133
Patented June 24, 1969

3,452,133

ANNEALING OF METAL-PLASTIC LAMINATES

Francis H. Bratton and Herbert J. Fick, Northfield, Minn., assignors to G. T. Schjeldahl Company, Northfield, Minn., a corporation of Minnesota Filed Mar. 7, 1966, Ser. No. 532,461
Int. Cl. B29c *25/00;* C21c *1/30*
U.S. Cl. 264—346 7 Claims

ABSTRACT OF THE DISCLOSURE

A method for dimensionally stabilizing a laminate structure which comprises a composite of copper and stress-oriented polyethylene terephthalate films secured together, the stabilization operation including the steps of (a) disposing the laminate structure in a substantially stress-free condition; (b) soaking the laminate at an annealing temperature of between about 300° F.–350° F. for a period of about eight hours, and thereafter cooling the laminate slowly to room temperature. An inert atmosphere may be utilized if desired for protecting surface brightness of the copper portion of the laminate.

The present invention relates generally to an improved technique for dimensionally stabilizing a metal-plastic laminate structure, and more specifically to a technique for stabilizing such a structure which is prepared from a layer of a metal such as copper and a film of a material such as stress oriented polyethyleneterephthalate. These two materials, being secured together to form a laminate structure are subjected to a heat treating or annealing operation wherein the resultant product achieves dimensional stability against mechanical stresses and thermal changes and stresses, and also against exposure to various chemicals including exposure to etching baths and the like. While "annealing" is mentioned, the heat treating process may not actually complete such an operation, but some softening of the metal is achieved.

In the preparation of various devices from laminate structures or a metal and a plastic film, it is frequently desirable to produce a product which will have dimensional stability under a variety of conditions. This is particularly true in the preparation of printed circuitry, printed wiring, and similar devices wherein dimensional uniformity is required under a variety of conditions, and particularly dimensional uniformity between repeat units of the same pattern. For example, in apparatus for actuating magnetic cores, printed wiring is frequently utilized to provide the conductor necessary for the field to switch the cores, disposed in an array, or the conductor necessary to sense the switching of these cores. The use of printed wiring in these applications requires an absolute maximum of dimensional stability in order that uniformity will be available between the various elements or cores in the array. In certain other applications, it is frequently desirable to make up a substantial number of circuits prior to their being mounted in the area where they are to be utilized. In these instances, it is again essential that uniformity be available between repeated units in order to better facilitate the production of the devices. Any instability which may occur due to exposure to thermal changes, chemical etching solutions and the like will adversely affect the capability of the material to be applied to this type of facility. Therefore, any degree of stability which can be built into a laminate, particularly an electrical laminate, will widen the base of use of the material.

In accordance with the present invention, an annealing or heat treating process is carried out wherein the laminate exposed to the annealing operation is stabilized mechanically, thermally, and chemically. The shrinkage of the material upon exposure to chemical etching solutions is stabilized, and is generally less than one third of that experienced by non-annealed material. The thermal and mechanical properties are likewise enhanced, and rendered highly stable under a variety of conditions. In accordance with this technique, a laminate consisting of a metal such as hard rolled copper bonded to a film of stress oriented polyethyleneterephthalate is initially disposed in a substantially stress-free condition. The laminate is then soaked in an atmosphere at an annealing temperature for a period of about five hours or more, and thereafter cooled back to room temperature. The cooling is preferably conducted relatively slowly. For stress oriented polyethyleneterephthalate, an annealing temperature between 300° and 350° F. is utilized, for a period of between about five and eight hours. If desired an inert atmosphere may be utilized.

It is therefore an object of the present invention to provide an improved technique for dimensionally stabilizing a laminate material, the laminate comprising, for example, one layer of a metal such as copper and a film of stress oriented polyethyleneterephthalate, the two members being secured together along two major opposed surfaces, such as by an adhesive bond or the like.

It is yet a further object of the present invention to provide an improved annealing technique for stabilizing a laminate of metal and stress oriented polyethyleneterephthalate, wherein the laminate is stabilized mechanically, thermally, and chemically after exposure to the annealing operation.

It is a further object of the present invention to provide an improved laminate for printed circuitry applications wherein the laminate has improved mechanical, thermal, and chemical stability.

Other and further objects of the present invention will become apparent to those skilled in the art upon a study of the following specification, appended claims, and accompanying drawing wherein:

Figure 1:
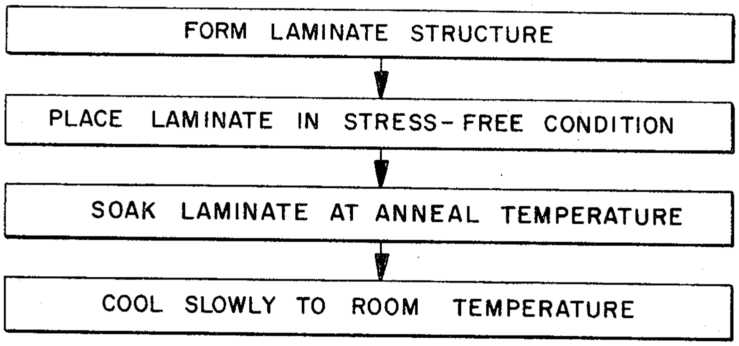
FIGURE 1 is a flow diagram showing the various steps carried out in the annealing operation of the present invention.

In accordance with the preferred modification of the present invention, a laminate is formed from a metal, preferably hard rolled copper, and a film of stress oriented polyethyleneterephthalate. Films of stress oriented polyethyleneterephthalate are available commercially under the name of "Mylar" from the E. I. du Pont de Nemours Company of Wilmington, Del. The copper and the film are preferably of about the same thickness, and may be, for example, for electrical applications in the range of ½ mil or more each. When bonded together in a uniform laminate structure with a polyester adhesive, the entire laminate has a film thickness of about 0.0013 inch when ½-mil copper and ½-mil stress oriented polyethyleneterephthalate are used, as a suitable bonding material, those polyesters which consist essentially of polyethyleneterephthalate, polyehylenesebacate, or mixtures thereof. Similar compounds may be conveniently utilized. Polyester adhesives are generally cured in the presence of an isocyanate. For purposes of uniformity it is generally preferred that a polyester base adhesive consisting essentially of ethyleneterephthalate-ethylene sebacate and ethylene isophthalate as the active material in the solids portion be utilized. Adhesives of this type are of course, commercially available. The copper utilized is preferably hard rolled copper, this material being selected to show the response to the annealing operation of the present invention.

After preparation, the laminate is preferably stored in roll form such as, for example, on a central core shaft or the like. The material is necessarily loosely coiled, splice free, and without a rigid core member when treated in accordance with the annealing operation of the present invention. It is essential that the material be placed in a stress-free relationship, and this is best achieved when the coil is formed loosely, and is free of a splice. It is then set on one end in a cool oven, and the temperature of the oven is increased to a temperature of about 300° F. and held at this temperature for a period from about five to eight hours. A temperature of 350° F. may be achieved, however it is at this point where the physical properties of the stress oriented polyethyleneterephthalate begin to fail, and while a temperature approaching this level is desirable, it must not be exceeded. Accordingly, a time of up to about five hours at a temperature of about 350° F. will be adequate to perform the annealing operation, while a temperature of about 300° F. requires a period of about eight hours to accomplish the annealing operation. Naturally, the material approaches full anneal at a somewhat shorter period of time, such as, for example, about five hours at 300° F. The oven may then be permitted to cool slowly to substantially room temperature, such as to about 150° F. before the laminate roll is removed if an inert atmosphere is used and if copper surface brightness retention is desired. While the operation is normally carried out in an air circulating oven, it is appreciated that an inert atmosphere may be employed as well. Among those gases which have been found satisfactory for the annealing operation are nitrogen, argon, carbon monoxide, or mixtures of carbon monoxide and carbon dioxide.

The time period is calculated for the soaking operation from the time that the inner portion of the laminate structure achieves the predetermined elevated temepratture. In other words, it is not sufficient to merely expose the material at a soaking temperature of, for example, 300° F. for five hours unless it is established that this temperature is reached by the entire laminate structure. Therefore, it is generally desirable to attach a temperature responsive element to the surface of the inner portion of the laminate roll prior to the annealing operation, in order to provide for a better control of the temperature of the entire system.

Most laminate structures do not suffer from a rapid temperature rise, however it is frequently desirable to hold the temperature rise cycle to a range of about 20° F. per minute. This will not establish any unusual stress condition in the material during the time that the temperature of the oven is on the increase.

It has been found that the laminate material exposed to the above operation must be cooled relatively slowly to room temperature. This is accomplished by partially opening the oven door and permitting the system to cool at a slow rate, such as, for example, at a rate of about 10° per minute. If a significantly faster rate of cooling is utilized, the material may buckle and thereby set up undesired stresses during the cooling operation. If an extremely fast rate of cooling is used, buckling of the loosely coiled roll of material may occur.

The copper preferred for working in the formation of laminates is one which is somewhat rigid. For preparing printed wiring, the copper is preferably soft. The present invention facilitates the use of hard copper during lamination and soft copper during later operations.

A preferred copper may be described as of minimum silver content, 99.9 or greater copper purity and sufficiently cold reduced to demonstrate a reduction of tensile from 50–60 thousand p.s.i. down to 20–35 thousand p.s.i. and an increase in elongation from 1–2 percent to better than 7 percent elongation after exposure to a temperature of 340° F. for one hour. Typically cold reductions of 75–80 percent are required. Copper of this designation allows heating cycles with minimum described times. This copper will reportedly manifest a softening at about 284° F.

It has been found that laminated material exposed to this operation will exhibit a total shrinkage of less than 0.2 percent when exposed to normal printed wiring uses, or when tested according to normal testing sequences. The tensile and elongation test of the copper foil will normally indicate that the tensile shall be found to be from 20,000 to 35,000 p.s.i. and elongation shall be at least 7 percent when ½-mil copper and ½-mil polyethyleneterephthalate are used., It will be appreciated that the initial preparation of the laminate provides a bond to a structure upon which the stress oriented polyethyleneterephthalate are used.

It will be appreciated that the initial preparation of the laminate provides a bond to a structure upon which the stress oriented polyethyleneterephthalate may rest during the annealing operation, and hence it is not permitted to become modified in its stress condition during the annealing operation. This particular treatment has been found, as indicated, to substantially enhance the mechanical, thermal and chemical stability of the material under the conditions normally encountered by printed wiring devices.

Figure 2:
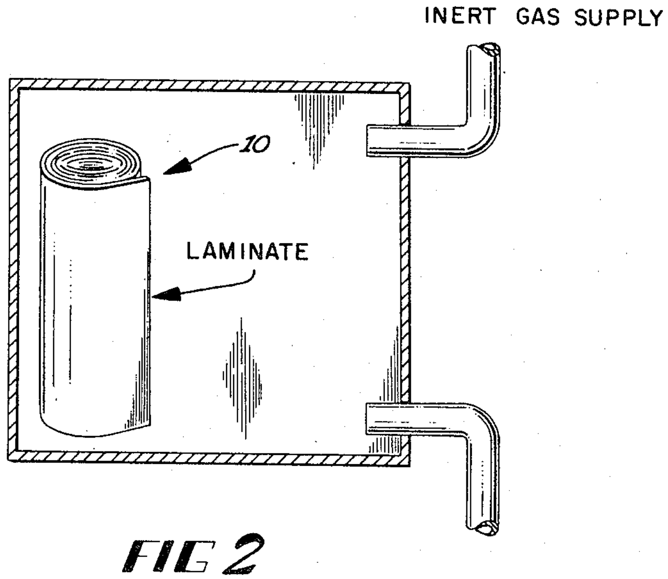
FIGURE 2 is a vertical sectional view of an enclosure in which the process of the present invention may be carried out.
Figure 3:
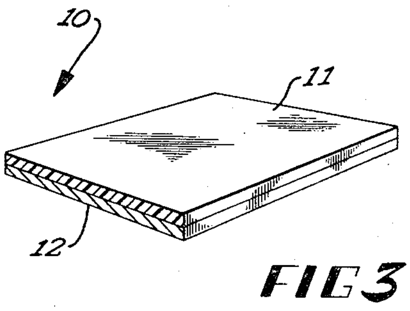
FIGURE 3 is a sectional view of a laminate structure which may be exposed to the annealing process of the present invention.

With particular attention now directed to FIGURE 3 of the drawings, it will be seen that a laminate structure is shown generally designated 10 and having a copper portion 11 and a stress oriented polyethyleneterephthalate portion 12. The enclosure shown in FIGURE 2 is shown for the purpose of illustrating how the annealing operation may be carried out in practice. It will be observed that the laminate is held in a roll form, and the enclosure is necessarily provided with appropriate heating controls and appropriate access ports and the like. Suitable vent couplings and the like are provided in order to establish a suitable flow of inert gas through the enclosure, as required. Of course, the process may be suitably employed with traveling webs moving between and through treating stations.

It will be, of course, appreciated that those skilled in the art may depart from those specific illustrations provided herein without necessarily departing from the spirit and scope of the present invention. Accordingly, it is understood that these details of the process are provided by way of illustration, and not by way of limitation.

We claim:

1. The method of dimensionally stabilizing a laminate structure comprising a layer of copper and a layer of stress-oriented polyethyleneterephthalate secured together along two opposed major surfaces, which method comprises:

(a) disposing the laminate structure in a substantially stress-free condition;
(b) subjecting said laminate to an atmosphere at an annealing temperature of between about 300° F. and 350° F. for a period of from about five hours to about eight hours; and
(c) cooling said laminate slowly to substantially room temperature at a rate of about 10° F. per minute.

2. The method as set forth in claim 1 being particularly characterized in that said stabilizing operation is conducted in an inert atmosphere.

3. The method of dimensionally stabilizing a laminate structure comprising a layer of hard rolled copper and stress oriented polyethyleneterephthalate secured together along two opposed major surfaces, which method comprises:

(a) disposing the laminate structure in a substantially stress-free condition;
(b) soaking said laminate while in said stress-free condition at an annealing temperature of about 300° F. for a period of about eight hours; and
(c) cooling said laminate slowly to substantially room temperature at a rate of about 10° F. per minute.

4. The method as set forth in claim 3 being particularly characterized in that said annealing and cooling operations are conducted in an inert atmosphere.

5. The method as set forth in claim 1 being particularly characterized in that said copper is cold rolled copper, and said copper and said stress-oriented polyethyleneterephthalate are bonded together by a polyester base adhesive.

6. The method as set forth in claim 1 being particularly characterized in that said copper is cold rolled copper and said copper and said stress-oriented polyethyleneterephthalate each have a thickness of about ½ mil.

7. The method of dimensionally stabilizing a laminate structure comprising a layer of cold rolled copper and a layer of stress-oriented polyethyleneterephthalate secured together along two opposed major surfaces, which method comprises:

(a) disposing the laminate structure in a substantially stress-free condition;

(b) subjecting said laminate to a heated atmosphere for a period of time sufficient to substantially anneal said layer of copper at a temperature between about 300° F. and 350° F.; and (c) cooling said laminate to substantially room temperature at a rate of about 10° F. per minute.

References Cited

UNITED STATES PATENTS

| | | | |
|---|---|---|---|
| 2,808,622 | 10/1957 | Stott et al. | 264—235 |
| 2,897,107 | 7/1959 | Carlen et al. | 148—13.2 |
| 2,961,365 | 11/1960 | Sroog | 161—214 |
| 3,143,738 | 8/1964 | Bigelow | 156—85 |
| 3,160,801 | 12/1964 | Haas et al. | 156—85 |
| 3,221,227 | 11/1965 | Devaney | 156—85 |
| 3,330,709 | 7/1967 | Zelnick | 156—85 |

JULIUS FROME, *Primary Examiner.*

A. H. KOECKERT, *Assistant Examiner.*

U.S. Cl. X.R.

156—80, 85; 161—411; 264—235